(12) United States Patent
Johansson

(10) Patent No.: US 12,021,375 B2
(45) Date of Patent: Jun. 25, 2024

(54) OVERVOLTAGE PROTECTION FOR HV BUSHING TEST TAP

(71) Applicant: Hitachi Energy Ltd, Zürich (CH)

(72) Inventor: Kenneth Johansson, Täby (SE)

(73) Assignee: HITACHI ENERGY LTD, Zürich (CH)

( * ) Notice: Subject to any disclaimer, the term of this patent is extended or adjusted under 35 U.S.C. 154(b) by 132 days.

(21) Appl. No.: 17/908,938

(22) PCT Filed: Feb. 25, 2021

(86) PCT No.: PCT/EP2021/054756
§ 371 (c)(1),
(2) Date: Sep. 2, 2022

(87) PCT Pub. No.: WO2021/175705
PCT Pub. Date: Sep. 10, 2021

(65) Prior Publication Data
US 2023/0089717 A1    Mar. 23, 2023

(30) Foreign Application Priority Data
Mar. 3, 2020  (EP) ..................... 20160556

(51) Int. Cl.
*H01H 31/12*    (2006.01)
*G01R 31/12*    (2020.01)
*H02H 9/06*    (2006.01)

(52) U.S. Cl.
CPC ........... *H02H 9/06* (2013.01); *G01R 31/1254* (2013.01)

(58) Field of Classification Search
CPC ............ G01R 31/1254; G01R 31/1245; G01R 31/1236; G01R 31/12; G01R 31/08;
(Continued)

(56) References Cited

U.S. PATENT DOCUMENTS 4,571,656 A * 2/1986 Ruckman ................. H02H 9/06
361/111
6,226,166 B1  5/2001 Gumley et al.
(Continued)

FOREIGN PATENT DOCUMENTS

JP    2002142354 A    5/2002
WO    2013178168 A1   12/2013

OTHER PUBLICATIONS

First Examination Report, Indian Patent Application No. 202247049461, Jul. 5, 2023, 7 pages.
(Continued)

*Primary Examiner* — Thang X Le
(74) *Attorney, Agent, or Firm* — Sage Patent Group

(57) ABSTRACT

A protection device configured for being electrically connected to a test tap of a HV bushing for protecting the bushing from transient overvoltages. The protection device includes at least two parallel connected protection branches connected between the test tap and a ground connector configured for connecting to ground. Each of the protection branches includes a plurality of parallel connected gas discharge tubes, a Transient-Voltage-Suppression (TVS) diode connected in series with the gas discharge tubes, and a resistor connected in series with the gas discharge tubes and across the TVS diode.

20 Claims, 1 Drawing Sheet

(58) Field of Classification Search
CPC . G01R 1/36; H02H 9/06; H02H 9/041; H02H 9/042
See application file for complete search history.

(56) References Cited

U.S. PATENT DOCUMENTS

| | | | |
|---|---|---|---|
| 8,680,939 | B2 | 3/2014 | Trautman et al. |
| 9,557,349 | B2 | 1/2017 | Kutzner et al. |
| 10,447,026 | B2* | 10/2019 | Kostakis ................ H02H 9/008 |
| 2004/0070913 | A1 | 4/2004 | Macanda |
| 2008/0197786 | A1 | 8/2008 | Schaible et al. |
| 2009/0085758 | A1 | 4/2009 | Eriksson |
| 2011/0299203 | A1 | 12/2011 | Ruess et al. |
| 2015/0207449 | A1 | 7/2015 | Clendenen et al. |
| 2015/0355237 | A1* | 12/2015 | Kutzner ................... G01R 1/36 324/110 |
| 2016/0276821 | A1* | 9/2016 | Politis ..................... H02H 9/041 |
| 2021/0344192 | A1* | 11/2021 | Zhang ...................... H02H 9/02 |

OTHER PUBLICATIONS

International Search Report and Written Opinion of the International Searching Authority, PCT/EP2021/054756, mailed Apr. 28, 2021, 16 pages.
Extended European Search Report dated Sep. 28, 2020 for European Patent Application No. 20160556-5, 8 pages.
Decision to Grant for Japanese Patent Application No. 2022-552972, mailed Sep. 5, 2023, 3 pages.

\* cited by examiner

OVERVOLTAGE PROTECTION FOR HV BUSHING TEST TAP

CROSS REFERENCE TO RELATED APPLICATIONS

This application is a 35 U.S.C. § 371 national stage application of PCT International Application No. PCT/EP2021/054756 filed on Feb. 25, 2021, which in turn claims foreign priority to European Patent Application No. 20160556.5, filed on Mar. 3, 2020, the disclosures and content of which are incorporated by reference herein in their entirety.

TECHNICAL FIELD

The present disclosure relates to an overvoltage protection for a test tap of a high-voltage (HV) bushing.

BACKGROUND

A test tap is comprised in a high-voltage (HV) bushing for connecting external equipment for monitoring internal properties of the bushing, e.g. electrical potential, partial discharges or losses in the insulation. External equipment connected to HV bushings test tap often cause high overvoltages during fast transients, due to the added inductance between the test tap and the grounded flange of the bushing. These overvoltages may destroy the insulation inside the bushing between the field-grading foil the test tap is connected to and the flange. These faults can spread into the main insulation of the condenser core of the bushing and cause failure of the bushing. Some external equipment has overvoltage protections built in for protecting the external equipment, however they do not have low enough inductance to protect the bushing.

SUMMARY

It is an objective of the present disclosure to provide improved protection of a HV bushing during a transient overvoltage (also called "transient").

According to an aspect of the present disclosure, there is provided a protection device configured for being electrically connected to a test tap of a HV bushing for protecting the bushing from transient overvoltages. The protection device comprises at least two parallel connected protection branches connected between the test tap and a ground connector configured for connecting to ground. Each of the protection branches comprises a plurality of parallel connected gas discharge tubes (GDT), a Transient-Voltage-Suppression (TVS) diode connected in series with the gas discharge tubes, and a resistor connected in series with the gas discharge tubes and across the TVS diode.

According to another aspect of the present disclosure, there is provided a HV bushing comprising a test tap and an embodiment of the protection device of the present disclosure and connected to the test tap.

According to another aspect of the present disclosure, there is provided an electrical system comprising an electrical device and an embodiment of the bushing of the present disclosure and arranged through a wall of a housing of the electrical device.

By using several parallel branches of voltage clipping components, a lower inductance of the whole circuit can be achieved. By using GDTs in series with the TVS diode, a lower parallel capacitance can be achieved, which may allow high frequency signals to pass and do not increase the capacitance. The TVS diodes are preferably used instead of varistors since TVS diodes age and change less in view of the number of transients. Discharge resistors are used to ensure both a dampening effect and to prevent unpredicted ignitions of the GDTs if the TVS is charged from an earlier transient.

It is to be noted that any feature of any of the aspects may be applied to any other aspect, wherever appropriate. Likewise, any advantage of any of the aspects may apply to any of the other aspects. Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated. The use of "first", "second" etc. for different features/components of the present disclosure are only intended to distinguish the features/components from other similar features/components and not to impart any order or hierarchy to the features/components.

BRIEF DESCRIPTION OF THE DRAWINGS

Embodiments will be described, by way of example, with reference to the accompanying drawings, in which.

DETAILED DESCRIPTION

Embodiments will now be described more fully hereinafter with reference to the accompanying drawings, in which certain embodiments are shown. However, other embodiments in many different forms are possible within the scope of the present disclosure. Rather, the following embodiments are provided by way of example so that this disclosure will be thorough and complete, and will fully convey the scope of the disclosure to those skilled in the art. Like numbers refer to like elements throughout the description.

Figure 1:
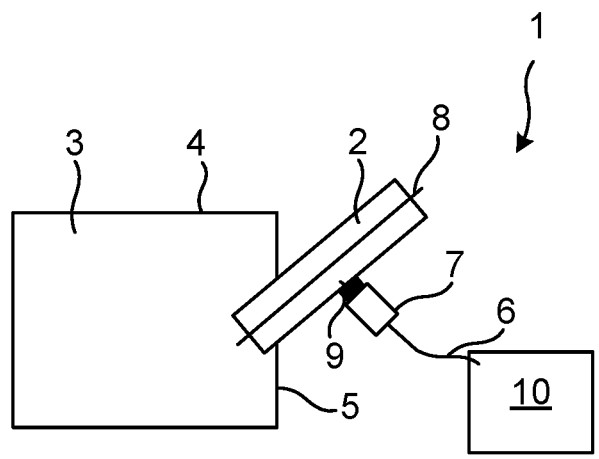
FIG. 1 is a schematic sectional illustration of an electrical system, in accordance with some embodiments of the present disclosure.

FIG. 1 illustrates an electrical system 1 comprising an electrical device 3 and a HV bushing 2 arranged through a wall 5 of a housing 4 of the electrical device 3. The electrical device 3 may e.g. be or comprise a transformer, e.g. a liquid-filled transformer, in which case the housing 4 may be or comprise a transformer tank, or the electrical device 3 may be or comprise a power electronic power converter in which case the housing 4 may be or comprise a valve hall.

The bushing 2 comprises an insulator defining a longitudinal through hole for a HV conductor 8 to pass through the bushing and thus through the wall 5. The insulator of the bushing 2 may e.g. comprise a condenser core having a plurality of interleaved field-grading layers of electrically conductive foils, e.g. aluminium foils. The bushing 2 is configured for HV applications, e.g. of voltages of at least 1 kV, e.g. at least 3 or 10 kV, e.g. up to 100 kV or up to 1000 kV.

A test tap 9 is comprised in the bushing 2, e.g. for measuring the electrical potential within the bushing. The test tap 9 may e.g. be connected to an outer (typically the outermost) field-grading layer of the condenser core of the bushing. Measurement equipment 10, external to the bushing 2, may be connected to the test tap 9 via an electrical conductor 6. Measuring equipment connected to the test tap may measure any of a variety of signals, from low to high frequencies and sometimes sensitive to added capacitance when measuring voltages by capacitive voltage division or measuring high frequencies.

The connection of the measurement equipment 10 may increase the risk for inductance which would increase the overvoltage in case of a transient which may damage the bushing. Specifically, the external measurement equipment 10 connected to the test tap 9 may often cause high overvoltages during fast transients, due to the added inductance between the test tap and the flange (ground) of the bushing, from the extra impedance internally in the measurement equipment, said flange being arranged for mounting the bushing to the wall 5. These overvoltages may destroy the insulation inside the bushing insulator between the field-grading layer connected to the test tap and the flange. These faults may spread into the main insulation and cause failure to the bushing. Some external equipment have overvoltage protections built in, however they may not have low enough internal inductance to protect the bushing itself. In contrast, the overvoltage protection device 7 which is in accordance with the present disclosure connected to the test tap 9, typically via the electrical conductor 6, is configured for protecting the bushing rather than the external measurement equipment.

Preferably, the protection device 7 is arranged close to the test tap 9, e.g. directly on the test tap, in order to reduce the inductance.

Figure 2:
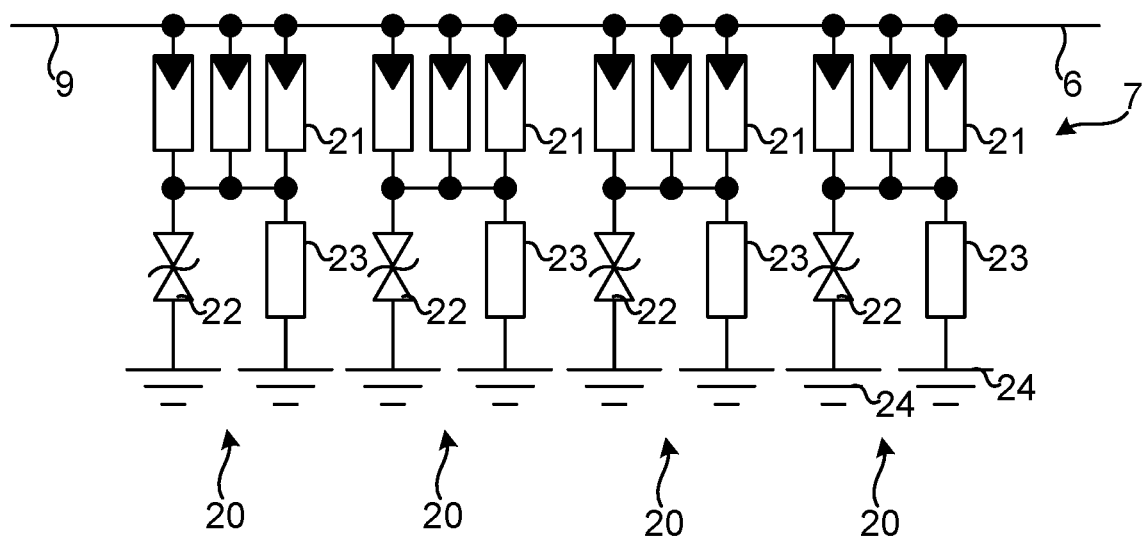
FIG. 2 is a schematic circuit diagram of an overvoltage protection, in accordance with some embodiments of the present disclosure.

FIG. 2 illustrates an embodiment of a protection device 7 connected to the test tap 9. The protection device comprises a plurality of protection branches 20 connected in parallel between the test tap and ground e.g. via ground connectors 24. In the embodiment of the figure, four branches 20 are used, which may be preferred in some embodiments. By using at least two, preferably at least four, e.g. four or eight, parallel protection branches 20, the inductance can be reduced. Also, a plurality of parallel branches 20 gives redundancy. A doubling of the number of branches 20 generally results in a halving of the inductance.

Each branch 20 comprises a plurality of parallel connected GDTs 21. The use of a plurality of parallel GDTs gives redundancy but also increases the speed with which the branch activates and cuts off the transient (reduced turn-on time), since there is statistically a higher probability that one of several GDT ignites faster than if there is only one. A plurality of parallel GDTs may also reduce the inductance, especially for fast transients. The GDTs may be conventional GDTs, typically filled with a noble gas. In the figure, three parallel GDTs 21 are used, which may be preferred in some embodiments, but in other embodiments more than three GDTs in parallel may be used. Typically, all GDTs 21 in the protection device 7 have the same properties, especially the same nominal ignition voltage. By using GTDs in series with the other components, a very low parallel capacitance may be achieved, which may allow high frequency signals to pass and not increase the so called C2 capacitance, i.e. the capacitance formed between a field-grading layer connected to the test tap 9 and the flange of the bushing.

In each branch 20, a TVS diode 22 is connected in series with the GDTs 21. For instance, the TVS diode 22 may be connected in series between the GDTs 21 and the ground connector 24 (as in the figure) or between the GDTs 21 and the test tap 9. The TVS diode 22 may have a capacitance that could keep a charged voltage from an earlier transient and then give a deviation in the turn-on voltage of the GDT. This is prevented by a resistor 23 connected across the TVS diode, typically providing a low ohmic parallel resistance over each TVS diode. The resistor 23 may also help by damping oscillations as its amplitude may go below the TVS diode voltage. Typically, the TVS diode 22 breakdown voltage is higher than the GDT 21 ignition voltage, which will ensure that all branches 20 ignite at least one of their GDTs 21 and connects them all in parallel to achieve a low inductance.

The protection device 7 is typically transparent to all frequencies until it is activated by a transient, and thus does not interfere with any measurement signals. Still, the protection device 7 may act fast, e.g. within a few nanoseconds such as within the range of 1-10 or 2-5 ns. Also, the protection device may be configured to handle high transient currents, e.g. of at least 40 kA. The low inductance may prevent higher voltages to be added to the test tap 9 during a fault transient. The protection device 7 may also dampen resonances during voltage clipping by absorbing energy. The protection device may reduce the risk of short circuiting an overvoltage to the flange which could generate another transient pulse. That implies that the protection device may clip the voltage to a certain level, e.g. of around some hundred volts. Typically, the protection device is not changing its impedance (capacitance or resistance) depending on the temperature. Generally, the protection device may reduce the risk of failure of the bushing 2, due to transients in the bushing, when a test equipment is connected to the test tap 9.

In some embodiments of the present disclosure, the TVS diode 22 of each branch 20 has a breakdown voltage which is higher than the ignition voltage of the GDTs 21 connected in series with the TVS diode, ensuring that at least one GDT of each branch ignites.

In some embodiments of the present disclosure, the protection device 7 comprises four parallel connected protection branches 20.

In some embodiments of the present disclosure, each branch 20 comprises three parallel connected GDTs 21.

The present disclosure has mainly been described above with reference to a few embodiments. However, as is readily appreciated by a person skilled in the art, other embodiments than the ones disclosed above are equally possible within the scope of the present disclosure, as defined by the appended claims.

The invention claimed is:

1. A protection device configured for being electrically connected to a test tap of a high-voltage (HV) bushing for protecting the bushing from transient overvoltages, the protection device comprising:
   at least two parallel connected protection branches connected between the test tap and a ground connector configured for connecting to ground;
   each of the at least two protection branches comprising:
   a plurality of parallel connected gas discharge tubes (GDTs);

a Transient-Voltage-Suppression (TVS) diode connected in series with the gas discharge tubes; and
a resistor connected in series with the gas discharge tubes and across the TVS diode.

2. The protection device of claim 1, wherein the TVS diode has a breakdown voltage which is higher than an ignition voltage of the GDTs.

3. The protection device of claim 1, wherein the at least two parallel connected protection branches comprises four parallel connected protection branches.

4. The protection device of claim 1, wherein the plurality of parallel connected GDTs comprises three parallel connected GDTs.

5. A HV bushing comprising:
a test tap; and a protection device of claim 1 connected to the test tap.

6. An electrical system comprising:
an electrical device; and the bushing of claim 5 arranged through a wall of a housing of the electrical device.

7. The electrical system of claim 6, further comprising a measurement equipment connected to the test tap via an electrical conductor.

8. The protection device of claim 1, wherein each GDT of the plurality of GDTs has an ignition voltage, and
wherein the TVS diode has a breakdown voltage greater than the ignition voltage of the plurality of GDTs.

9. The protection device of claim 1, wherein the plurality of protection branches comprise four protection branches.

10. The protection device of claim 9, wherein, for each protection branch of the plurality of protection branches, the plurality of GDTs comprises three GDTs.

11. The protection device of claim 1, wherein, for each protection branch of the plurality of protection branches, the plurality of GDTs comprises three GDTs.

12. The HV bushing of claim 11, wherein the resistor and the TVS diode are connected in parallel between the intermediate node and the ground connector.

13. The HV bushing of claim 11, wherein each GDT of the plurality of GDTs has an ignition voltage, and
wherein the TVS diode has a breakdown voltage greater than the ignition voltage of the plurality of GDTs.

14. The HV bushing of claim 11, wherein the plurality of protection branches comprise four protection branches.

15. The HV bushing of claim 14, wherein, for each protection branch of the plurality of protection branches, the plurality of GDTs comprises three GDTs.

16. A protection device for a high voltage (HV) bushing, the protection device comprising:
a plurality of protection branches connected in parallel between a test tap of the HV bushing and a ground connector,
each protection branch of the plurality of protection branches comprising:
a plurality of gas discharge tubes (GDTs) connected in parallel between the test tap and an intermediate node;
a Transient-Voltage-Suppression (TVS) diode connected in series between the intermediate node and the ground connector; and
a resistor connected in series between the intermediate node and the ground connector.

17. The protection device of claim 16, wherein the resistor and the TVS diode are connected in parallel between the intermediate node and the ground connector.

18. A HV bushing comprising:
a test tap;
a ground connector; and
a protection device connected between the test tap and the ground connector, the protection device comprising:
a plurality of protection branches connected in parallel between the test tap and the ground connector,
each protection branch of the plurality of protection branches comprising:
a plurality of gas discharge tubes (GDTs) connected in parallel between the test tap and an intermediate node;
a Transient-Voltage-Suppression (TVS) diode connected in series between the intermediate node and the ground connector; and
a resistor connected in series between the intermediate node and the ground connector.

19. An electrical system comprising:
an electrical device comprising a housing, the housing comprising a wall; and
the bushing of claim 18 arranged through a wall of the housing of the electrical device.

20. The electrical system of claim 19, further comprising a measurement equipment electrically connected to the test tap.

* * * * *